(12) United States Patent
Ishikawa

(10) Patent No.: US 9,935,620 B2
(45) Date of Patent: Apr. 3, 2018

(54) SEMICONDUCTOR DEVICE

(71) Applicant: Renesas Electronics Corporation, Tokyo (JP)

(72) Inventor: Naoshi Ishikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/967,024

(22) Filed: Dec. 11, 2015

(65) Prior Publication Data

US 2016/0277013 A1    Sep. 22, 2016

(30) Foreign Application Priority Data

Mar. 18, 2015  (JP) .................................. 2015-054649

(51) Int. Cl.
*H03K 5/15* (2006.01)

(52) U.S. Cl.
CPC .................................. *H03K 5/1506* (2013.01)

(58) Field of Classification Search
CPC ... G01C 19/00; G01C 19/60; H03M 2201/00; H03M 2201/4225; H03M 2201/4233; H03M 2201/02; H03K 5/00; H03K 5/1502; H03K 5/1506
USPC ....................................................... 327/242
See application file for complete search history.

(56) References Cited

U.S. PATENT DOCUMENTS

| | | | | |
|---|---|---|---|---|
| 2002/0116468 A1* | 8/2002 | Ishikawa | ............... | G06F 13/423 709/208 |
| 2006/0140045 A1* | 6/2006 | Kishimoto | ........... | G11C 7/1051 365/189.05 |
| 2009/0315605 A1* | 12/2009 | Aoyagi | .................. | H03K 5/133 327/276 |
| 2014/0035650 A1* | 2/2014 | Zerbe | ....................... | H03L 7/06 327/299 |
| 2016/0062930 A1* | 3/2016 | Kijima | .................. | G06F 13/364 710/110 |

OTHER PUBLICATIONS

Data Sheet (Ver2.0 (DM00077036)) of microcomputer STM32F437xx/439xx manufactured by STMicroelectronics, pp. 1-216, Jan. 2014.

\* cited by examiner

*Primary Examiner* — Lincoln Donovan
*Assistant Examiner* — David Mattison
(74) *Attorney, Agent, or Firm* — McGinn IP Law Group, PLLC

(57) ABSTRACT

The present invention provides a technique for further improving the processing efficiency in accordance with the setting of the number of waits in a semiconductor device that arbitrates data transfer through a bus between a plurality of bus masters and a plurality of bus slaves. A semiconductor device includes a clock supplying unit that independently supplies clocks to a plurality of bus slaves and a plurality of bus masters. The number of waits in accordance with an operating frequency can be set for each bus slave such as a memory. As the setting of the number of waits becomes smaller, the clock supplying unit improves the operating frequency by controlling a phase difference between the clocks supplied to the bus masters and the bus slaves in accordance with the number of waits set for each bus slave.

20 Claims, 6 Drawing Sheets

SEMICONDUCTOR DEVICE

CROSS-REFERENCE TO RELATED APPLICATIONS

The disclosure of Japanese Patent Application No. 2015-054649 filed on Mar. 18, 2015 including the specification, drawings and abstract is incorporated herein by reference in its entirety.

BACKGROUND

The disclosure relates to a semiconductor device that transfers data between a plurality of bus masters and a plurality of bus slaves through a bus, and particularly to a technique for improving the operation efficiency of a semiconductor device in which the number of waits can be set for each device in accordance with an operating frequency.

In a semiconductor device such as a microcomputer, a plurality of bus masters and a plurality of bus slaves are coupled to a bus, and the bus masters and the bus slaves transfer signals through the bus. The bus masters are processors such as CPUs (Central Processing Units). The bus slaves are, for example, built-in memories. The CPUs as the bus masters access the built-in memories that are the bus slaves through the bus. The microcomputer independently supplies clocks to the bus masters and the bus slaves. The number of waits can be set for each bus slave such as a built-in memory, and each bus slave is operated in accordance with the set number of waits (see "Data Sheet (Ver2.0 (DM00077036)) of microcomputer STM32F437xx/439xx manufactured by STMicroelectronics").

For example, it is assumed that the maximum frequency at which each bus slave can be operated is Fmax, and the maximum number of waits that can be set for each bus slave is Wmax. On the assumption that the operating frequency at which each bus slave is operated with W waits is an operating frequency F(W), each bus slave can be operated at the operating frequency $F(W)=Fmax \times (W+1)/(Wmax+1)$. For example, it is assumed that the maximum frequency Fmax at which each bus slave can be operated is 180 Mhz, and the settable maximum number of waits Wmax is 5. In this case, each bus slave can be operated at the frequency up to the operating frequency $F(0)=30$ Mhz in the case of 0 wait. Similarly, each bus slave can be operated at the frequency up to the operating frequency $F(1)=60$ Mhz in the case of 1 wait, at the frequency up to the operating frequency $F(2)=90$ Mhz in the case of 2 waits, at the frequency up to the operating frequency $F(3)=120$ Mhz in the case of 3 waits, at the frequency up to the operating frequency $F(4)=150$ Mhz in the case of 4 waits, and at the frequency up to the operating frequency $F(5)=180$ Mhz in the case of 5 waits.

SUMMARY

In the development of a semiconductor device such as a microcomputer, the timing or the like is designed on the basis of the maximum operating frequency in some cases. The phase between the clocks that are independently supplied to each bus master and each bus slave is fixed to an optimum value in the design of timing at the maximum frequency in some cases. Further, in the case where the path of the memory that is the bus slave becomes a critical path, the rate of the process by the microcomputer is controlled at the operating frequency of the memory. In the case where the phase between the clocks supplied to each bus master and each bus slave is fixed, the number of waits is changed in the path of the memory on the output side in accordance with the operating frequency (the operating frequency is determined in accordance with the setting of the number of waits). Thus, the output timing becomes constant irrespective of the frequency. Specifically, the timing of data transfer on the output side of the memory becomes constant irrespective of the setting of the operating frequency.

On the other hand, the range of the timing of inputting data into the memory becomes larger as the operating frequency becomes lower. For example, the range of the input timing of a signal CE (chip enable signal) and a signal ADDR (address signal) input into the path of the memory on the input side becomes larger as the operating frequency becomes lower (for example, on the assumption that the maximum operating frequency F(5) of the microcomputer is 180 MHz, when the microcomputer is operated while setting the operating frequency F(0) at, for example, 30 MHz (0 wait) by reducing the number of waits). Therefore, in the case where the timing is designed on the basis of the maximum operating frequency, the rate of the process by the microcomputer can be increased when the setting of the operating frequency is lowered.

Therefore, a technique for further improving the processing efficiency in accordance with the setting of the number of waits has been required in the semiconductor device that transfers data through the bus between the bus masters and the bus slaves.

The other objects and novel features will become apparent from the description of the specification and the accompanying drawings.

A semiconductor device according to an embodiment includes a plurality of bus slaves and a plurality of bus masters that accesses the bus slaves through a bus. The semiconductor device includes a clock supplying unit that supplies clocks to the bus slaves and the bus masters. The number of waits in accordance with an operating frequency can be set for at least any one of the bus slaves. The clock supplying unit is configured to control a phase difference between the clocks supplied to the bus masters and the bus slaves in accordance with the number of waits set for each bus slave.

According to the semiconductor device of the embodiment, a higher frequency can be set in the case where the number of waits is set smaller because the phase difference between the clocks is controlled in accordance with the number of waits of each bus slave as compared to a case in which the phase difference between the clocks supplied to each bus master and each bus slave is fixed. Accordingly, the processing efficiency can be further improved.

DETAILED DESCRIPTION

Figure 1:
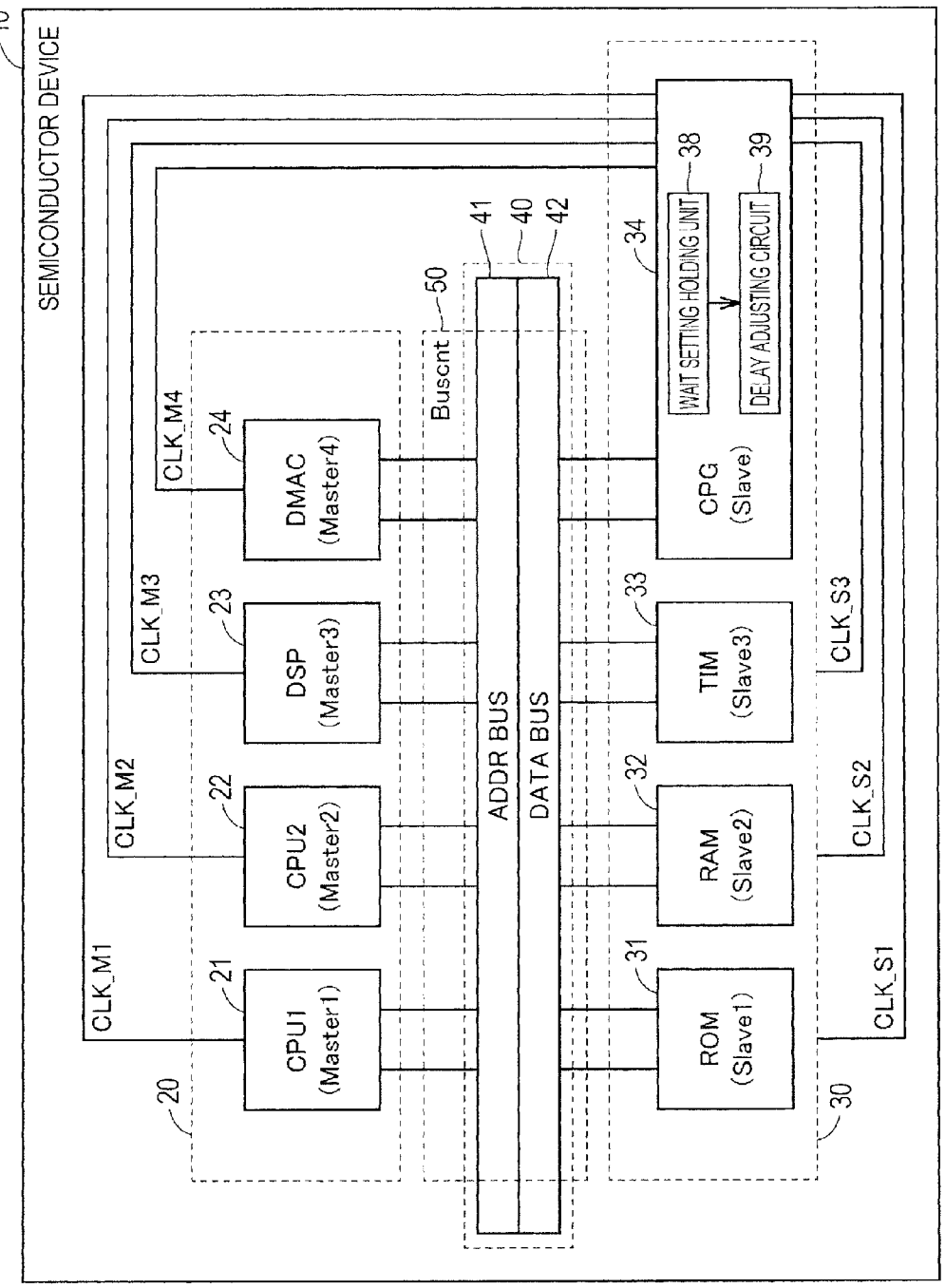
FIG. 1 is a block diagram for showing a configuration of a semiconductor device 10 according to an embodiment.

Hereinafter, embodiments of the present invention will be described with reference to the drawings. In the following description, the same constitutional elements are given the same reference numerals. The names and functions thereof are also the same. Thus, the detailed explanations thereof will not be repeated.

First Embodiment

A semiconductor device of an embodiment will be described with reference to the drawings.

<Configuration of Semiconductor Device>

FIG. 1 is a block diagram for showing a configuration of a semiconductor device 10 of the embodiment. As shown in FIG. 1, the semiconductor device 10 includes a bus master 20 having a plurality of bus masters (for example, a first CPU (Central Processing Unit) 21, a second CPU 22, a DSP (Digital Signal Processor) 23, a DMAC (Direct Memory Access controller) 24, and other devices), a bus slave 30 having a plurality of bus slaves (for example, a ROM (Read Only Memory) 31, a RAM (Random Access Memory) 32, a TIM (timing signal output circuit) 33, a CPG (Clock Pulse Generator) 34, and other devices), a bus 40, and a bus control circuit 50. The first CPU 21 and the second CPU 22 control an operation of the semiconductor device 10.

The CPG 34 includes a clock oscillator, and independently supplies a clock signal to each bus master and each bus slave. For example, the CPG 34 supplies a clock signal CLK_M1 to the first CPU 21, supplies a clock signal CLK_M2 to the second CPU 22, supplies a clock signal CLK_M3 to the DSP 23, and supplies a clock signal CLK_M4 to the DMAC 24. Further, the CPG 34 supplies a clock signal CLK_S1 to the ROM 31, supplies a clock signal CLK_S2 to the RAM 32, and supplies a clock signal CLK_S3 to the TIM 33. The CPG 34 can adjust the frequencies and phase difference of the clock signals supplied to each bus master and each bus slave. The CPG 34 includes a wait setting holding unit 38 and a delay adjusting circuit 39. The wait setting holding unit 38 holds the setting of the number of waits of each bus slave. The delay adjusting circuit 39 adjusts the phase difference between the clock signals supplied to each bus master and each bus slave by delaying the clock signals supplied to each bus master and each bus slave. A configuration of the delay adjusting circuit 39 will be described later. The CPG 34 may accept the setting of the number of waits of each bus slave from another device, or the number of waits may be set by a user. The CPG 34 includes the wait setting holding unit 38 and the delay adjusting circuit 39, and thus the phase difference between the clocks supplied to each bus master and each bus slave is controlled in accordance with the setting of the number of waits of each bus slave.

The bus master 20 and the bus slave 30 are coupled to the bus 40 that functions as a data transfer route for address transfer and data transfer between the bus masters and the bus slaves. The bus 40 includes an address bus 41 and a data bus 42. The address bus 41 is a bus to transfer an address signal used when each bus master accesses each bus slave. The data bus 42 is a bus to transfer data between each bus master and each bus slave.

The bus control circuit 50 controls address transfer and data transfer between the bus masters and the bus slaves through the bus 40. In the case where the bus masters compete with each other when accessing a bus slave, the bus control circuit 50 arbitrates in accordance with the priority set for each bus master.

Figure 2:
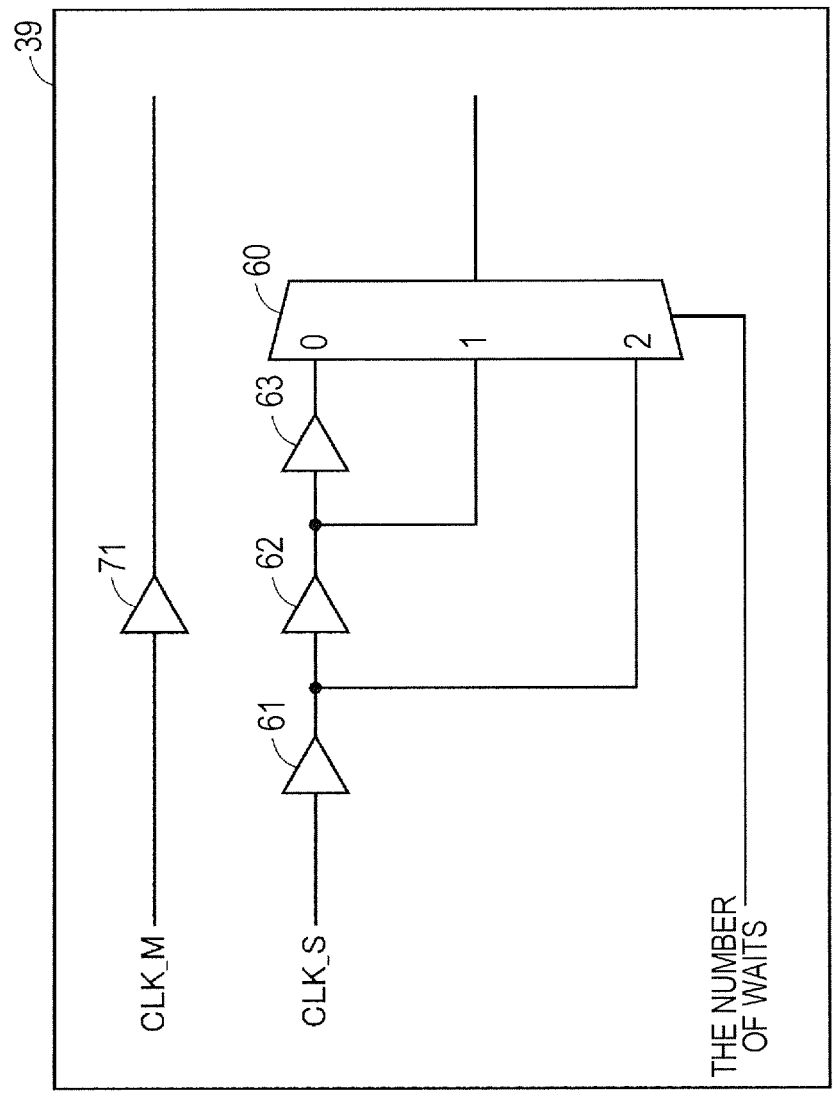
FIG. 2 is a diagram for showing a detailed configuration of a delay adjusting circuit 39.

FIG. 2 is a diagram for showing a detailed configuration of the delay adjusting circuit 39. As shown in FIG. 2, the delay adjusting circuit 39 includes a master clock delay circuit 71 that accepts a clock signal CLK_M generated in the delay adjusting circuit 39 to control the operation of each bus master and that supplies the same to each bus master, and circuits (a slave clock delay circuit 61, a slave clock delay circuit 62, a slave clock delay circuit 63, and a multiplexer 60) that control the delay amount of a clock signal CLK_S for controlling the operation of each bus slave in accordance with the setting of the number of waits of each bus slave. In the example of FIG. 2, it is assumed that the delay of the clock signal CLK_M that is a clock on the bus master side is fixed irrespective of the setting of the number of waits held in the wait setting holding unit 38 by the delay adjusting circuit 39. It should be noted that FIG. 2 shows an example in which the range of the numbers of waits that can be set by the CPG 34 is 0 to 2, namely, three kinds. However, the present invention is not limited to the three kinds.

The delay adjusting circuit 39 couples the delay circuits (the slave clock delay circuit 61, the slave clock delay circuit 62, and the slave clock delay circuit 63) in series, and adjusts the number of stages of the delay circuits through which the clock signal CLK_S has passed in accordance with the setting of the number of waits. Accordingly, the delay adjusting circuit 39 controls the delay amount of the clock signal CLK_S that is a clock on the bus slave side in accordance with the setting of the number of waits. In the example of FIG. 2, as the setting of the number of waits becomes smaller (closer to 0), the delay amount of the clock signal CLK_S is increased.

As described above, the delay adjusting circuit 39 includes the delay circuits. The CPG 34 allows the delay circuits to delay the clock, and supplies the clock signal to each bus slave in accordance with the number of waits set for each bus slave. Accordingly, the delay adjusting circuit 39 controls the phase difference between the clocks supplied to each bus master and each bus slave.

<Operation of Semiconductor Device>

Next, with reference to FIG. 3 and FIG. 4, a process in which the CPG 34 controls the phase difference between the clock signals supplied to each bus master and each bus slave in accordance with the setting of the number of waits will be described.

<Operation of Related Art>

First, for the purpose of comparison with the CPG 34 of the embodiment, an operation in the case where the phase difference between the clocks supplied to each bus master and each bus slave is set constant irrespective of the setting of the number of waits will be described as a related art.

Figure 3:
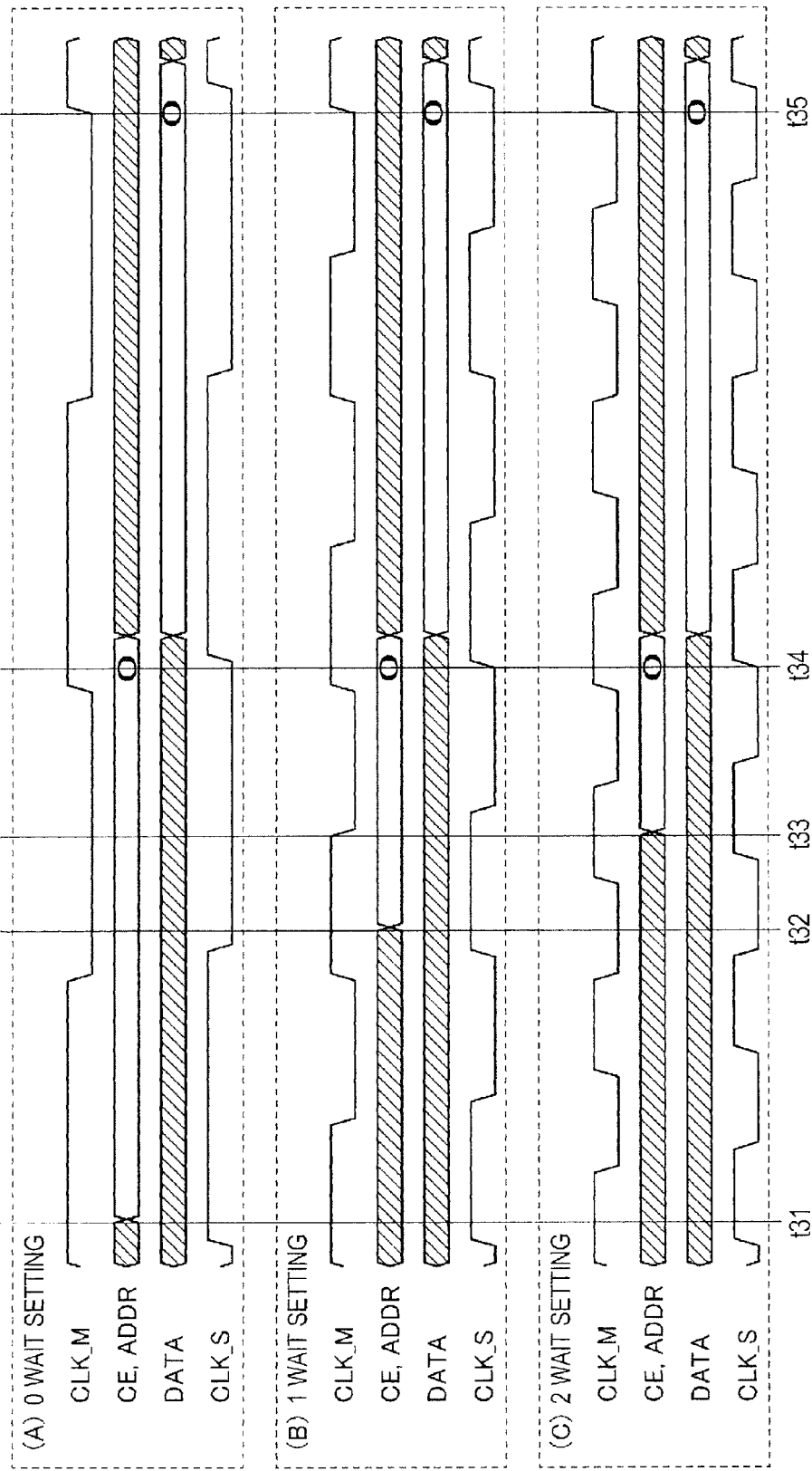
FIG. 3 is a diagram for showing the timing of data transfer between a bus master and a bus slave in the case where the phase difference between a clock CLK_M supplied to the bus master and a clock CLK_S supplied to the bus slave is fixed irrespective of the setting of the number of waits.

FIG. 3 is a diagram for showing the timing of data transfer between a bus master and a bus slave in the case where the phase difference between the clock CLK_M supplied to the bus master and the clock CLK_S supplied to the bus slave is fixed irrespective of the setting of the number of waits. It should be noted that the example of FIG. 3 will be described on the assumption that the bus slave is a memory.

A state (A) of FIG. 3 shows the timing of data transfer between a bus master and a bus slave in the case where the number of waits is set at 0 (no wait). A state (B) shows an example in which the number of waits is set at 1. A state (C) shows an example in which the number of waits is set at 2. In FIG. 3, a clock signal supplied to the bus master by the CPG 34 is represented as a clock signal CLK_M. In FIG. 3, a chip enable signal input to the bus slave that is a memory is represented as a signal CE, and an address signal is represented as a signal ADDR. A data signal output from the memory is represented as a signal DATA. A clock signal supplied by the CPG 34 to the bus slave that is a memory is represented as a clock signal CLK_S.

As shown in the state (A), the state (B), and the state (C) of FIG. 3, an address signal is input from the bus master to the memory through the bus at timing t31 in the case of 0 wait setting (state (A)). Further, an address signal is input from the bus master to the memory through the bus at timing t32 in the case of 1 wait setting (state (B)). Further, an address signal is input from the bus master to the memory through the bus at timing t33 in the case of 2 wait setting.

After timing t34, the memory outputs data of an address designated with the address signal to the data bus in accordance with the address signal (signal ADDR) accepted from the bus master through the bus. At timing t35, the bus master accepts the data output from the memory to the data bus.

As described above, the semiconductor device 10 controls the operating frequency in accordance with the setting of the number of waits, and thus the timing when the memory accepts an input of the address signal and outputs the data of the address indicated by the address signal to the data bus is constant (timing t35) irrespective of the number of waits. Further, as shown in FIG. 3, the phase difference between the clock signal CLK_M and the clock signal CLK_S is constant irrespective of the setting of the number of waits in the related art. Thus, when comparing the state (C) with the state (A), as the number of waits is set relatively smaller (closer to 0), there is sufficient timing of data input to the memory. Specifically, a period of time in which the address signal is output to the address bus in order to input data into the memory can be set after the timing t31 in the case of 0 wait setting. On the contrary, a period of time in which the address signal is output to the address bus is set after the timing t33 in the case of 2 wait setting, and thus becomes shorter as compared to the case of 0 wait setting. Specifically, as the setting of the number of waits becomes smaller and closer to 0, there is room for improving the processing performance of a microcomputer.

Operation of First Embodiment

Figure 4:
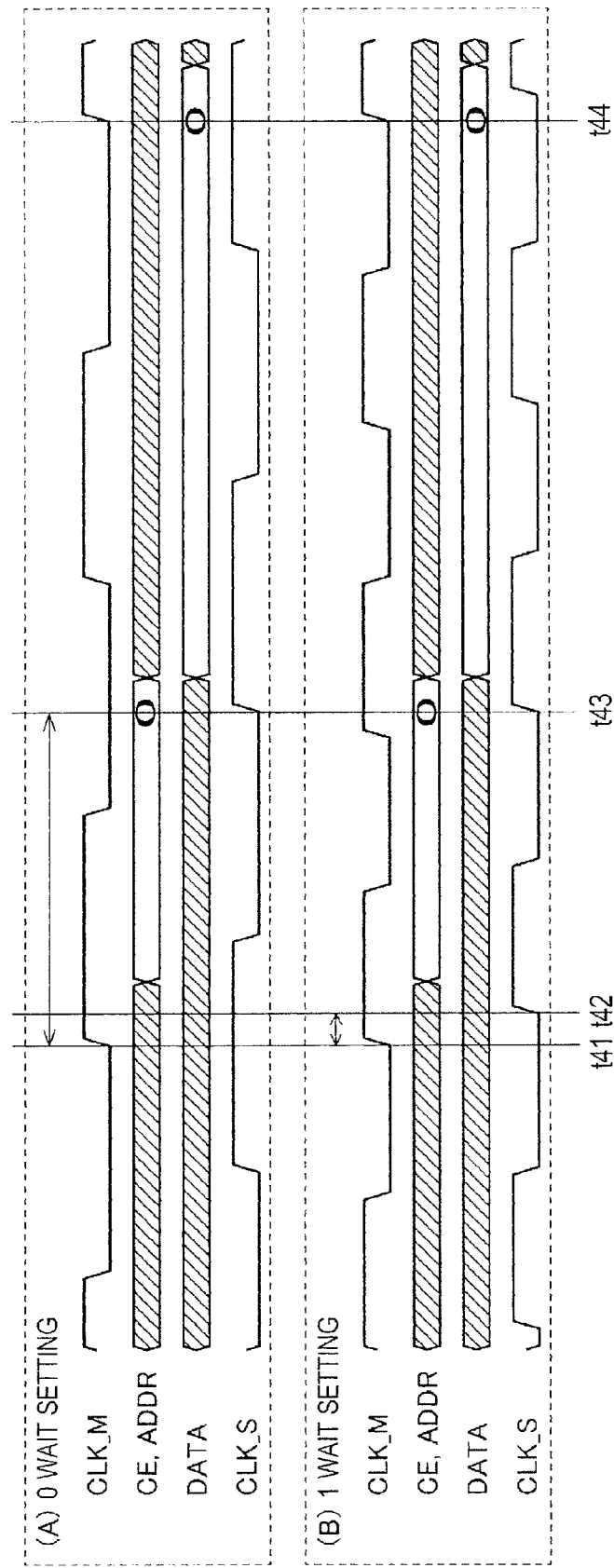
FIG. 4 is a diagram for showing an operation example in the case where the delay adjusting circuit 39 controls the phase difference between the clock signals supplied to each bus master and each bus slave in accordance with the setting of the number of waits.

FIG. 4 is a diagram for showing an operation example in the case where the delay adjusting circuit 39 controls the phase difference between the clock signals supplied to a bus master and a bus slave in accordance with the setting of the number of waits.

A state (A) of FIG. 4 shows the timing of data transfer between the bus master and the bus slave in the case where the number of waits is set at 0. A state (B) shows an example in the case where the number of waits is set at 1.

As shown in the state (A), the delay adjusting circuit 39 controls in such a manner that the phase difference between the clock signal CLK_M and the clock signal CLK_S in the case where the number of waits is set at 0 becomes larger than that in the case where the number of waits is set at 1. Specifically, in the case where the number of waits is set at 1, the delay adjusting circuit 39 adjusts the phase difference between the clock signal CLK_M and the clock signal CLS_S to a period of time corresponding to a difference between timing t41 and timing t42. On the contrary, in the case where the number of waits is set at 0, the delay adjusting circuit 39 largely delays the clock signal supplied to the bus slave as compared to that in the case where the number of waits is set at 1 in the embodiment. In the case where the number of waits is set at 0, the delay adjusting circuit 39 adjusts the phase difference between the clock signal CLK_M and the clock signal CLK_S to a period of time corresponding to a difference between the timing t41 and timing t43. As described above, since the phase difference between the clock signal CLK_M and the clock signal CLK_S is adjusted, the microcomputer can make faster the operating frequency in the case where the number of waits is set relatively smaller. Specifically, the semiconductor device 10 of the first embodiment can raise the upper limit of the frequency in the case where the setting of the number of waits is reduced as compared to the related art.

For example, it is assumed that the maximum frequency at which each bus slave can be operated is Fmax, and the maximum number of waits that can be set for each bus slave is Wmax. On the assumption that the operating frequency at which each bus slave is operated with W waits is an operating frequency $F(W)$, each bus slave can be operated at the operating frequency $F(W)=Fmaxx(W+1)/(Wmax+1)$ in the case where the phase difference between the clock signals independently supplied to each bus master and each bus slave is not adjusted. On the contrary, as described in the first embodiment, as the setting of the number of waits becomes smaller, the operating frequency can be further improved by adjusting the phase difference between the clock signals independently supplied to each bus master and each bus slave in accordance with the setting of the number of waits. Specifically, the delay adjusting circuit 39 of the first embodiment controls to supply the clock signals, and thus each bus slave can be operated up to the frequency satisfying the operating frequency $(W)=Fmaxx(W+2)/(Wmax+2)$. For example, on the assumption that the maximum frequency Fmax is 180 Mhz and the settable maximum number of waits Wmax is 5, each bus slave is operated at $F(0) \leq 30$ MHz in the related art, whereas each bus slave can be operated at about $F(0) \leq 51$ MHz according to the embodiment. Further, each bus slave is operated at $F(1) \leq 60$ MHx in the related art, whereas each bus slave can be operated at about $F(1) \leq 77$ MHz according to the embodiment. Further, each bus slave is operated at $F(2) \leq 90$ MHz in the related art, whereas each bus slave can be operated at about $F(2) \leq 102$ MHz according to the embodiment. Further, each bus slave is operated at $F(3) \leq 120$ MHz in the related art, whereas each bus slave can be operated at about $F(3) \leq 128$ MHz according to the embodiment. Further, each bus slave is operated at $F(4) \leq 150$ MHz in the related art, whereas each bus slave can be operated at about $F(4) \leq 154$ MHz according to the embodiment.

Summary of First Embodiment

The semiconductor device 10 of the first embodiment is configured using the bus masters, the bus, and the bus slaves. In the semiconductor device 10, the clock coupled to each bus master and the clock coupled to each bus slave are independently supplied from the clock supplying circuit. The semiconductor device 10 can adjust the phase difference between the clock supplied to each bus master and the clock supplied to each bus slave. Further, the semiconductor device 10 is a system that can set the number of waits of access to each bus slave. In such a system, the upper-limit frequency can be optimized by adjusting the phase difference between the clocks supplied to each bus master and each bus slave in accordance with the setting of the number of waits.

Second Embodiment

Figure 5:
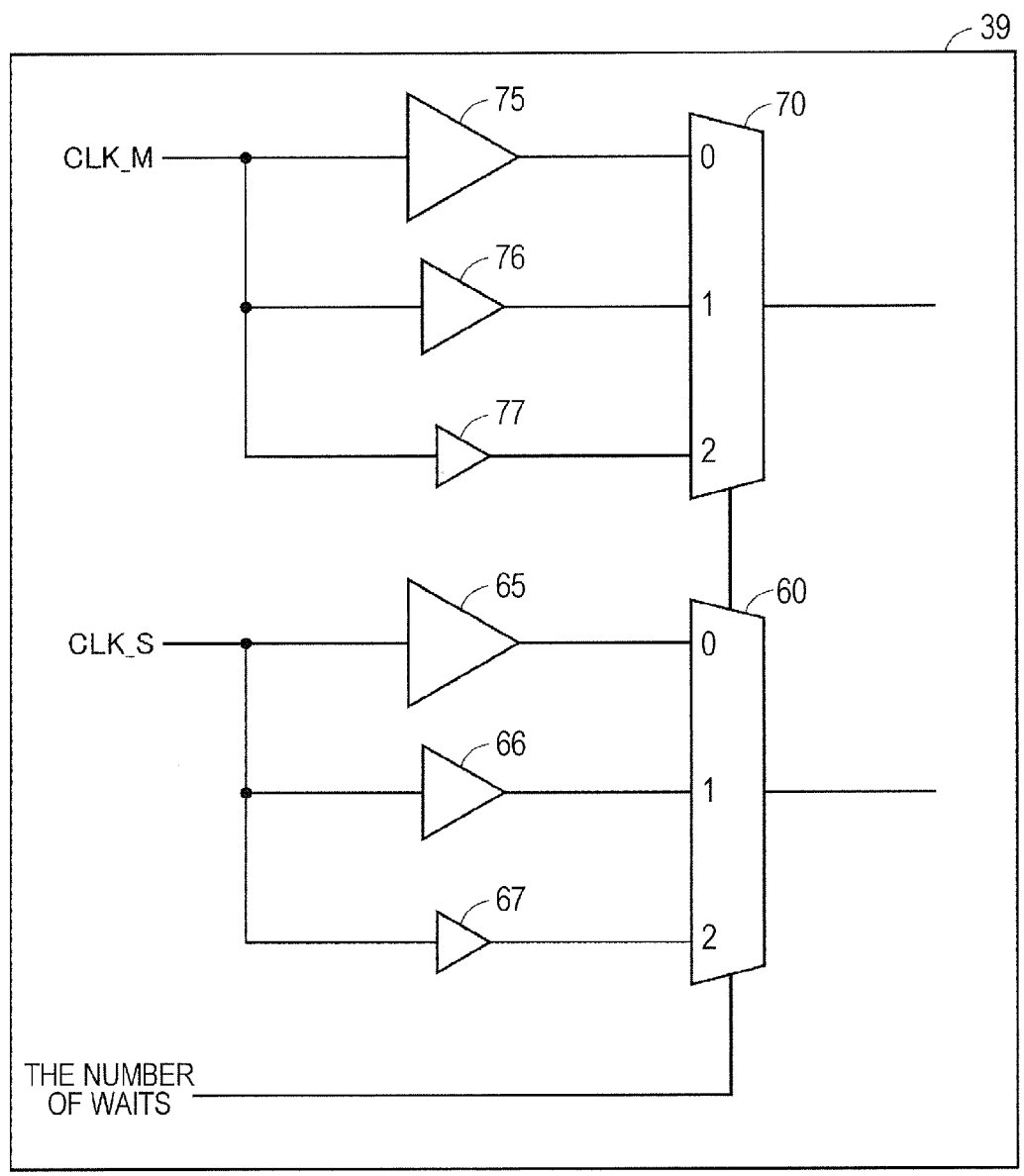
FIG. 5 is a diagram for showing a configuration of the delay adjusting circuit 39 in the case where the clocks supplied to each bus master and each bus slave are delayed.
Figure 6:
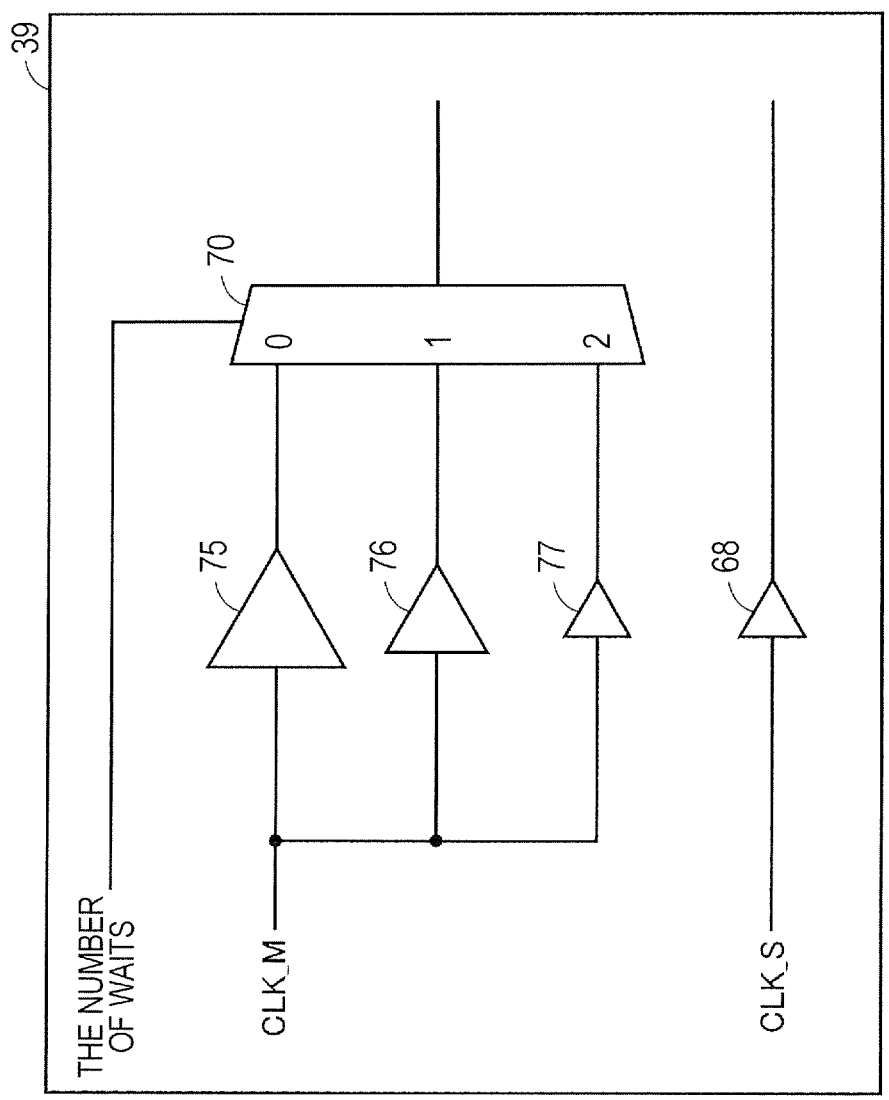
FIG. 6 is a diagram for showing a configuration of the delay adjusting circuit 39 in the case where the delay of the clock signal CLK_S supplied to each bus slave is fixed.

With reference to FIG. 5 and FIG. 6, the delay adjusting circuit 39 of another embodiment will be described.

In the first embodiment, described is a configuration in which the delay adjusting circuit 39 delays the clock supplied to each bus slave in accordance with the setting of the number of waits. The configuration of the delay adjusting circuit 39 is not limited to this. For example, the delay adjusting circuit 39 may separately delay the clock supplied to each bus master and the clock supplied to each bus slave in accordance with the setting of the number of waits as shown in FIG. 5 in the second embodiment.

FIG. 5 is a diagram for showing a configuration of the delay adjusting circuit 39 in the case where the clock supplied to each bus master and the clock supplied to each bus slave are separately delayed. As shown in FIG. 5, the delay adjusting circuit 39 includes a multiplexer 70 that switches a clock signal CLK_M supplied to each bus master in accordance with the setting of the number of waits. To respective inputs of the multiplexer 70, input are the clock signals CLK_M having passed through delay circuits (a master clock delay circuit 75, a master clock delay circuit 76, and a master clock delay circuit 77) with different delay amounts. Further, the delay adjusting circuit 39 includes a multiplexer 60 that switches a clock signal CLK_S supplied to each bus slave in accordance with the setting of the number of waits. To respective inputs of the multiplexer 60, input are the clock signals CLK_S having passed through delay circuits (a slave clock delay circuit 65, a slave clock delay circuit 66, and a slave clock delay circuit 67) with different delay amounts. According to such a configuration, the delay adjusting circuit 39 can adjust the phase difference between the clock signal CLK_M and the clock signal CLK_S in accordance with the setting of the number of waits.

<Modified Example>

In the first embodiment, described is a configuration in which the delay amount of the clock signal CLK_M supplied to each bus master is fixed irrespective of the setting of the number of waits, and the delay amount of the clock signal CLK_S supplied to each bus slave is set in accordance with the setting of the number of waits. In the second embodiment, described is a configuration in which both of the clock signal CLK_M and the clock signal CLK_S are delayed in accordance with the setting of the number of waits. In addition to the above, as a modified example, the present invention may be configured in such a manner that the delay amount of the clock signal CLK_S supplied to each bus slave is fixed irrespective of the setting of the number of waits, and the delay amount of the clock signal CLK_M supplied to each bus master is set in accordance with the setting of the number of waits.

FIG. 6 is a diagram for showing a configuration of the delay adjusting circuit 39 in the case where the delay of the clock signal CLK_S supplied to each bus slave is fixed. In the modified example, the delay adjusting circuit 39 includes a slave clock delay circuit 68 that accepts the clock signal CLK_S generated in the delay adjusting circuit 39 to control the operation of each bus slave and supplies the same to each bus slave.

According to the semiconductor device 10 described in each embodiment, the operating frequency in each wait can be improved by adjusting the phase difference between the built-in memory clock and bus master clock in each wait to an optimum value in a system such as a microcomputer incorporating a memory circuit. Accordingly, the performance of the semiconductor device 10 is improved, and thus the electric power efficiency is improved.

The invention achieved by the inventors has been concretely described above on the basis of the embodiments. However, it is obvious that the present invention is not limited to the embodiments, but can be variously changed without departing from the scope of the present invention.

It should be understood that the embodiments disclosed herein are illustrative examples in all respects, and do not limit the present invention. The scope of the invention is represented by not the above description but the claims, and the disclosure intends to include all changes in the meaning and scope equivalent to the claims.

What is claimed is:

1. A semiconductor device comprising:
   a plurality of bus slaves;
   a plurality of bus masters that accesses the bus slaves through a bus; and
   a clock supplying unit that supplies clocks to the bus slaves and the bus masters,
   wherein the number of waits in accordance with an operating frequency can be set for at least any one of the bus slaves, and
   wherein the clock supplying unit is configured to control a phase difference between the clocks supplied to the bus masters and the bus slaves in accordance with the number of waits set for each bus slave.

2. The semiconductor device according to claim 1,
   wherein the clock supplying unit includes delay circuits, and
   wherein the controlling of the phase difference between the clocks by the clock supplying unit includes supplying of the clocks to at least any one of the bus masters and the bus slaves by delaying the clocks using the delay circuits in accordance with the number of waits set for each bus slave.

3. The semiconductor device according to claim 2,
   wherein the delay circuits with different delay amounts of the clock supplying unit are configured to be coupled in parallel, and
   wherein the controlling of the phase difference between the clocks by the clock supplying unit includes supplying of the clocks to at least any one of the bus masters and the bus slaves by delaying the clocks while selecting any one of the delay circuits in accordance with the number of waits.

4. The semiconductor device according to claim 2,
   wherein the delay circuits of the clock supplying unit are configured to be coupled in series, and
   wherein the controlling of the phase difference between the clocks by the clock supplying unit includes supplying of the clocks to at least any one of the bus masters and the bus slaves by delaying the clocks while selecting any one of the clocks having differently passed through the delay circuits coupled in series in accordance with the number of waits.

5. The semiconductor device according to claim 1,
   wherein the controlling of the phase difference between the clocks by the clock supplying unit includes delaying of the clocks supplied to the bus slaves in accordance with the number of waits among the bus masters and the bus slaves.

6. The semiconductor device according to claim 5,
   wherein the bus slaves include memories, and wherein the clock supplying unit delays the clocks supplied to the memories in accordance with the number of waits set for each memory.

7. The semiconductor device according to claim 1, wherein the phase difference between the clocks supplied to each of the bus masters and each of the bus slaves is variable.

8. The semiconductor device according to claim 1, wherein the clock supplying unit further comprises a delay adjusting circuit that adjusts a number of stages of a plurality of delay circuits through which one of the clocks has passed in accordance with the setting of the number of waits.

9. The semiconductor device according to claim 1, wherein the clock supplying unit further comprises a delay adjusting circuit that adjusts a delay amount through which one of the clocks has passed in accordance with the setting of the number of waits.

10. The semiconductor device according to claim 1, wherein the clock supplying unit further comprises a delay adjusting circuit by adjusting a delay amount controls the phase difference between the clocks supplied to each bus master and each bus slave in accordance with the setting of the number of waits.

11. A semiconductor device comprising:
a plurality of bus slaves;
a plurality of bus masters that accesses the bus slaves through a bus; and
a clock supplying unit that supplies clocks to the bus slaves and the bus masters,
wherein the clock supplying unit is configured to control a phase difference between the clocks supplied to the bus masters and the bus slaves in accordance with the number of waits set for each bus slave.

12. The semiconductor device according to claim 11, wherein the clock supplying unit includes delay circuits, and
wherein the controlling of the phase difference between the clocks by the clock supplying unit includes supplying of the clocks to at least any one of the bus masters and the bus slaves by delaying the clocks using the delay circuits in accordance with the number of waits set for each bus slave.

13. The semiconductor device according to claim 12, wherein the delay circuits with different delay amounts of the clock supplying unit are configured to be coupled in parallel, and
wherein the controlling of the phase difference between the clocks by the clock supplying unit includes supplying of the clocks to at least any one of the bus masters and the bus slaves by delaying the clocks while selecting any one of the delay circuits in accordance with the number of waits.

14. The semiconductor device according to claim 12, wherein the delay circuits of the clock supplying unit are configured to be coupled in series, and
wherein the controlling of the phase difference between the clocks by the clock supplying unit includes supplying of the clocks to at least any one of the bus masters and the bus slaves by delaying the clocks while selecting any one of the clocks having differently passed through the delay circuits coupled in series in accordance with the number of waits.

15. The semiconductor device according to claim 11, wherein the controlling of the phase difference between the clocks by the clock supplying unit includes delaying of the clocks supplied to the bus slaves in accordance with the number of waits among the bus masters and the bus slaves.

16. The semiconductor device according to claim 15, wherein the bus slaves include memories, and
wherein the clock supplying unit delays the clocks supplied to the memories in accordance with the number of waits set for each memory.

17. The semiconductor device according to claim 11, wherein the phase difference between the clocks supplied to each of the bus masters and each of the bus slaves is variable.

18. The semiconductor device according to claim 11, wherein the clock supplying unit further comprises a delay adjusting circuit that adjusts a number of stages of a plurality of delay circuits through which one of the clocks has passed in accordance with the setting of the number of waits.

19. The semiconductor device according to claim 11, wherein the clock supplying unit further comprises a delay adjusting circuit that adjusts a delay amount through which one of the clocks has passed in accordance with the selling of the number of waits.

20. The semiconductor device according to claim 11, wherein the clock supplying unit further comprises a delay adjusting circuit by adjusting a delay amount controls the phase difference between the clocks supplied to each bus master and each bus slave in accordance with the setting of the number of waits.

* * * * *